US008878549B2

(12) United States Patent
Nakanishi et al.

(10) Patent No.: US 8,878,549 B2
(45) Date of Patent: Nov. 4, 2014

(54) AC IMPEDANCE MEASURING DEVICE

(75) Inventors: Hirofumi Nakanishi, Tokyo (JP);
Shuhei Okada, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 739 days.

(21) Appl. No.: 13/048,029

(22) Filed: Mar. 15, 2011

(65) Prior Publication Data
US 2011/0227587 A1 Sep. 22, 2011

(30) Foreign Application Priority Data

Mar. 16, 2010 (JP) .................................. 2010-058729

(51) Int. Cl.
*G01R 27/28* (2006.01)
*G01R 31/36* (2006.01)

(52) U.S. Cl.
CPC ................................. *G01R 31/3662* (2013.01)
USPC ............. 324/649; 320/134; 702/76; 324/126; 324/76.21

(58) Field of Classification Search
USPC ......................................................... 324/649
See application file for complete search history.

(56) References Cited

U.S. PATENT DOCUMENTS

| 5,473,244 | A * | 12/1995 | Libove et al. ................. 324/126 |
| 5,881,130 | A * | 3/1999 | Zhang ........................ 379/27.08 |
| 6,002,238 | A * | 12/1999 | Champlin ..................... 320/134 |
| 6,262,563 | B1 * | 7/2001 | Champlin ..................... 320/134 |
| 6,502,046 | B1 * | 12/2002 | Yoon et al. ...................... 702/76 |
| 6,687,631 | B2 * | 2/2004 | Yoon et al. ...................... 702/76 |
| 7,554,294 | B2 * | 6/2009 | Srinivasan et al. ............. 320/132 |
| 8,067,942 | B2 * | 11/2011 | Pan et al. ....................... 324/509 |
| 2003/0065461 | A1 * | 4/2003 | Yoon et al. ...................... 702/76 |
| 2003/0102907 | A1 * | 6/2003 | Tasker et al. ..................... 330/2 |
| 2009/0226770 | A1 * | 9/2009 | Manabe et al. .................. 429/13 |
| 2010/0039695 | A1 * | 2/2010 | Govil et al. .................... 359/290 |
| 2010/0081022 | A1 * | 4/2010 | Imamura et al. ................ 429/23 |
| 2011/0025348 | A1 * | 2/2011 | Chetham et al. .............. 324/649 |

FOREIGN PATENT DOCUMENTS

| JP | 2007-017405 A | 1/2007 |
| JP | 2007-258661 A | 10/2007 |
| JP | 2007-265895 A | 10/2007 |
| JP | 2008-064684 A | 3/2008 |
| JP | 2009-244180 A | 10/2009 |

OTHER PUBLICATIONS

European Search Report, dated Jul. 8, 2011, issued in Application No. 11158131.0.
Office Action dated Feb. 21, 2014 issued by the State Intellectual Property Office of the People's Republic of China in counterpart Chinese Patent Application No. 201110063207.X.

* cited by examiner

*Primary Examiner* — Benjamin M Baldridge
(74) *Attorney, Agent, or Firm* — Sughrue Mion, PLLC (57) ABSTRACT

An AC impedance measuring device includes: a signal generator configured to provide a first signal on which a period signal is superimposed to a DUT; a Fourier transform unit configured to perform Fourier transform on current data and voltage data output from the DUT using a transformation window while sequentially shifting a start time of the transformation window, thereby obtaining a plurality of Fourier transform data strings of the voltage data and the current data; a difference sequence calculator configured to sequentially calculate a first difference sequence of the Fourier transform data strings of the voltage data and a second difference sequence of the Fourier transform data strings of the current data; and an impedance calculator configured to calculate an impedance of the DUT based on a ratio of the first difference sequence and the second difference sequence.

9 Claims, 6 Drawing Sheets

AC IMPEDANCE MEASURING DEVICE

This application claims priority from Japanese Patent Applications No. 2010-058729, filed on Mar. 16, 2010, the entire contents of which are herein incorporated by reference.

BACKGROUND

1. Technical Field

The present disclosure relates to an AC impedance measuring device. More particularly, the present disclosure relates to the improvement of the measurement of AC impedance characteristics during the charge and discharge of a battery.

2. Related Art

In recent years, rechargeable secondary batteries have drawn attention in terms of the environment and costs. In the secondary battery research and development field, there is a demand for the measurement of impedance characteristics at a desired frequency with high accuracy.

Figure 6:
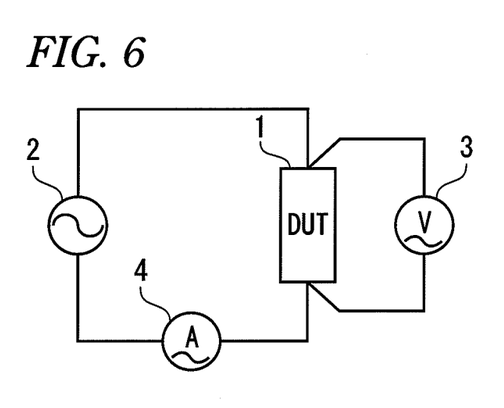
FIG. 6 is a schematic diagram illustrating the structure of an example of an AC impedance measuring device according to the related art.

FIG. 6 is a schematic diagram illustrating a structure for measuring the impedance of the secondary battery using an AC method. An oscillator 2 applies an AC signal to a secondary battery, which is a device under test (hereinafter, referred to as a "DUT") 1, and a voltmeter 3 and an ammeter 4 measure the terminal voltage and current of the DUT 1, respectively. An amplitude ratio and a phase difference are calculated based on the measured values of the voltage and current. In this way, the impedance of the DUT 1 is calculated.

The calculated impedance of the DUT 1 has amplitude information and phase information and thus can be represented by a complex number. The impedance of the DUT 1 can be displayed as a point on a complex number plane in which the horizontal axis indicates a real number and the vertical axis indicates an imaginary number. In particular, a graph in which the polarity of the imaginary part is inverted and impedance at each frequency is plotted is called a Cole-Cole plot, which is generally used as an index for determining the internal characteristics or deterioration of the DUT 1 in, for example, the electrochemical field.

There is a method of performing Fourier transform on the measured voltage and current and obtaining the ratio thereof in order to calculate impedance at each frequency. In this case, the voltage and current are measured in a stable state without a transient response. When a voltage and current data cutout section (hereinafter, referred to as a "transformation window") for Fourier transform is an integral multiple of the signal period, the impedance calculation result has no relation to the start phase of the transformation window and it is possible to accurately calculate impedance.

Even when the transformation window is not an integral multiple of the signal period, it is possible to reduce an error in the measurement of impedance by performing Fourier transform using sampling data with a period longer than the signal period or calculating impedance using a window function, such as a Harming window function or a Hamming window function.

JP-A-2007-265895 describes measuring impedance characteristics with only a DC component at a frequency f of almost 0 Hz (low frequency region), without measuring a response to an AC signal, thereby measuring the characteristics of a fuel cell at a high speed.

JP-A-2007-258661 describes using AC impedance measurement to evaluate a laminated ceramic capacitor in the manufacture of the laminated ceramic capacitor.

JP-A-2007-17405 describes using AC impedance measurement in the evaluation of the degree of rebar corrosion.

However, in the evaluation of the material characteristics, in order to measure impedance under the conditions that are as close to the actual use conditions as possible, it is necessary to measure the impedance in a state in which a constant current flows or there is a transient variation.

However, in the case of batteries or capacitors, when a constant current continuously flows, a terminal voltage is gradually changed due to, for example, the diffusion of ions, chemical reaction, and internal capacity.

When an AC signal is applied in the transient state, the output voltage of the DUT in which the AC signal is superimposed on the transient response is measured. When impedance is calculated using a value obtained by performing Fourier transform on the output voltage, the impedance includes an error due to the transient response.

There is a method which calculates an approximate expression of the transient response from the measured data using, for example, multiple regression analysis. However, in the method, it takes a long time to calculate the approximate expression and there is a large error in calculation.

When a window function, such as a Hanning window function or a Hamming window function, is used, measurement time longer than the signal period is required in order to reduce an error.

In addition, there is a method that shifts the phase of the transformation window once and calculates the influence of the transient response during Fourier transform based on an impedance difference. However, when the transient response cannot be linearly approximated, it is difficult to reduce an error.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages.

Accordingly, it is an illustrative aspect of the present invention to provide an AC impedance measuring device that measures impedance with a small error even in the transient response of the voltage or the current.

According to one or more illustrative aspects of the present invention, there is provided an AC impedance measuring device. The device includes: a signal generator configured to provide a first signal on which a period signal is superimposed to a DUT (device under test); a Fourier transform unit configured to perform Fourier transform on current data and voltage data output from the DUT using a transformation window having a time width that is an integral multiple of a period of the first signal, while sequentially shifting a start time of the transformation window, thereby obtaining a plurality of Fourier transform data strings of the voltage data and the current data, wherein at least one of the current data and the voltage data includes a transient response; a difference sequence calculator configured to sequentially calculate a first difference sequence of the Fourier transform data strings of the voltage data and a second difference sequence of the Fourier transform data strings of the current data; and an impedance calculator configured to calculate an impedance of the DUT based on a ratio of the first difference sequence and the second difference sequence.

According to one or more illustrative aspects of the present invention, the Fourier transform unit is configured to sequentially shift the start time of the transformation window in a range of one-sixth to five-sixths of the period of the first signal.

According to one or more illustrative aspects of the present invention, the period signal includes a plurality of frequency components, and the impedance calculator is configured to calculate the impedance of the DUT for each of the frequency components.

According to one or more illustrative aspects of the present invention, the device further includes: a sampling unit configured to convert the current data and the voltage data output from the DUT into a digital signal based on a sample clock.

According to the present invention, even in the transient response of a voltage or a current, it is possible to significantly reduce an influence on the calculation of impedance. Even when an output variation cannot be linearly approximated, it is possible to measure impedance with high accuracy. It is possible to measure impedance in a short time without waiting for the output of a stepwise input to be stabilized.

Other aspects and advantages of the present invention will be apparent from the following description, the drawings and the claims.

DETAILED DESCRIPTION OF EXEMPLARY EMBODIMENTS

Figure 1:
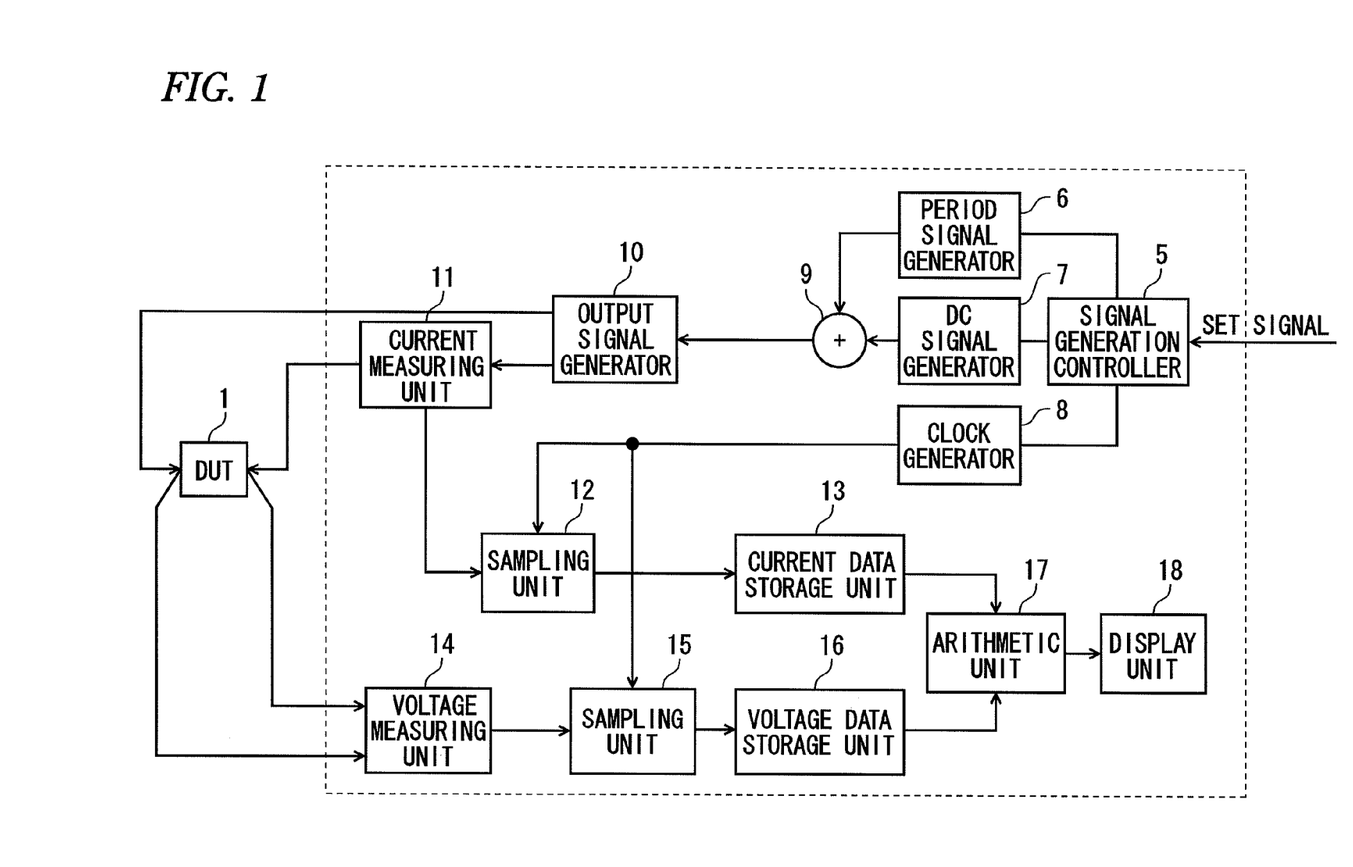
FIG. 1 is a block diagram illustrating an embodiment of the invention.

Hereinafter, exemplary embodiments of the present invention will be described with reference to the accompanying drawings. FIG. 1 is a block diagram illustrating an embodiment of the invention. In FIG. 1, a signal generation controller 5 controls a period signal generator 6, a DC signal generator 7, and a clock generator 8 to generate and output predetermined signals based on set signals.

The period signal generator 6 outputs a predetermined period signal to one input terminal of an adder 9, and the DC signal generator 7 outputs a predetermined DC signal to the other input terminal of the adder 9. The adder 9 outputs a signal in which the period signal is superimposed on the DC signal to an output signal generator 10.

The output signal generator 10 applies a current or voltage signal in which the period signal is superimposed on the DC signal to a DUT 1.

The current measuring unit 11 measures the current flowing through the DUT 1 and provides a current signal to a sampling unit 12. The sampling unit 12 converts the current signal measured by the current measuring unit 11 into a digital signal based on a sample clock received from the clock generator 8 and stores the digital signal in a current data storage unit 13.

A voltage measuring unit 14 measures the terminal voltage of the DUT 1 and provides a voltage signal to a sampling unit 15. The sampling unit 15 converts the voltage signal measured by the voltage measuring unit 14 into a digital signal based on the sample clock received from the clock generator 8 and stores the digital signal in a voltage data storage unit 16.

An arithmetic unit 17 reads the current data stored in the current data storage unit 13 and the voltage data stored in the voltage data storage unit 16, removes the influence of a transient response, and performs a predetermined operation on the impedance of the DUT 1.

A display unit 18 displays the operation result of the impedance of the DUT 1 by the arithmetic unit 17 in an appropriate form.

Figure 2:
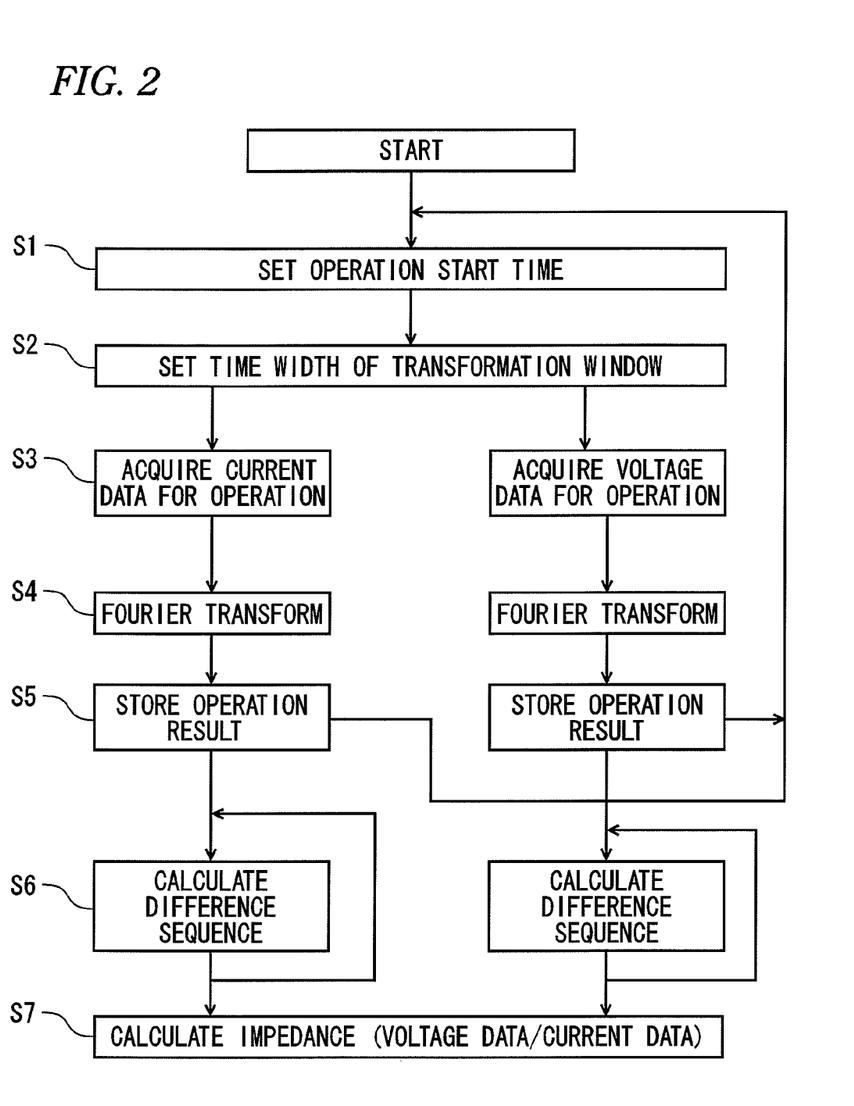
FIG. 2 is a flowchart illustrating the schematic flow of a processing operation of an arithmetic unit 17.

FIG. 2 is a schematic flowchart illustrating the flow of a processing operation of the arithmetic unit 17. First, the arithmetic unit 17 sets an operation start time (Step S1) and sets the time width of a transformation window (Step S2). Then, the arithmetic unit 17 acquires current data and voltage data as Fourier transform data used for an operation (Step S3).

The arithmetic unit 17 performs Fourier transform on the acquired current data and voltage data (Step S4). Then, the arithmetic unit 17 stores the transform result and creates a data string (Step S5). Steps S1 to S5 are repeatedly performed a predetermined number of times while changing the operation start time.

Then, the arithmetic unit 17 uses a plurality of Fourier transform strings calculated in this way to sequentially calculate the difference sequence of the plurality of Fourier transform data strings (Step S6). Then, the arithmetic unit 17 calculates the impedance of the DUT 1 from the ratio of the current data and the voltage data based on the calculation result of the difference sequence (Step S7).

Figure 3:
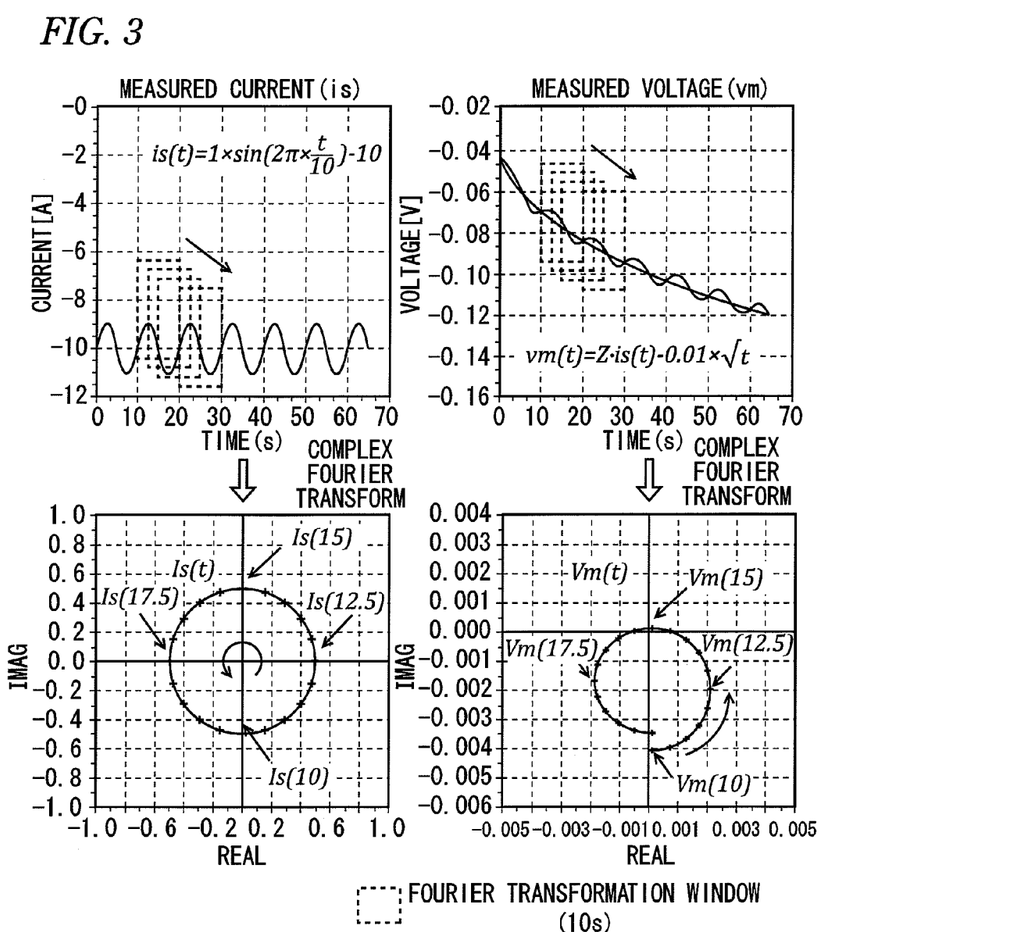
FIG. 3 is a diagram illustrating the trajectory of the Fourier transform result when a start time varies.

Next, a detailed impedance calculating operation in current control will be described. FIG. 3 is a diagram illustrating the trajectory of the Fourier transform result of a voltage and a current measured at both ends of the DUT 1 when an AC current of 1 Ao–p/0.1 Hz is applied to the DUT 1 in a 10 A discharge state and the start time of the transformation window is changed. The internal impedance of the DUT 1 is 4 mΩ and a transient response voltage is $-0.11 \times \sqrt{t}[V]$, based on the actual battery impedance measurement result.

The time width of the transformation window is 10 s and the short-time Fourier transform results of the measured current and the measured voltage at the start time t of the transformation window are Is(t) and Vm(t), respectively.

The short-time Fourier transform result when the transformation window is continuously shifted from t=10 s draws the trajectory shown at the lower part of FIG. 3. The Fourier transform result of the current draws a circle having the origin as its center, and the Fourier transform result of the voltage is affected by a transient response component and does not draw a circle, unlike the current.

Figure 4:
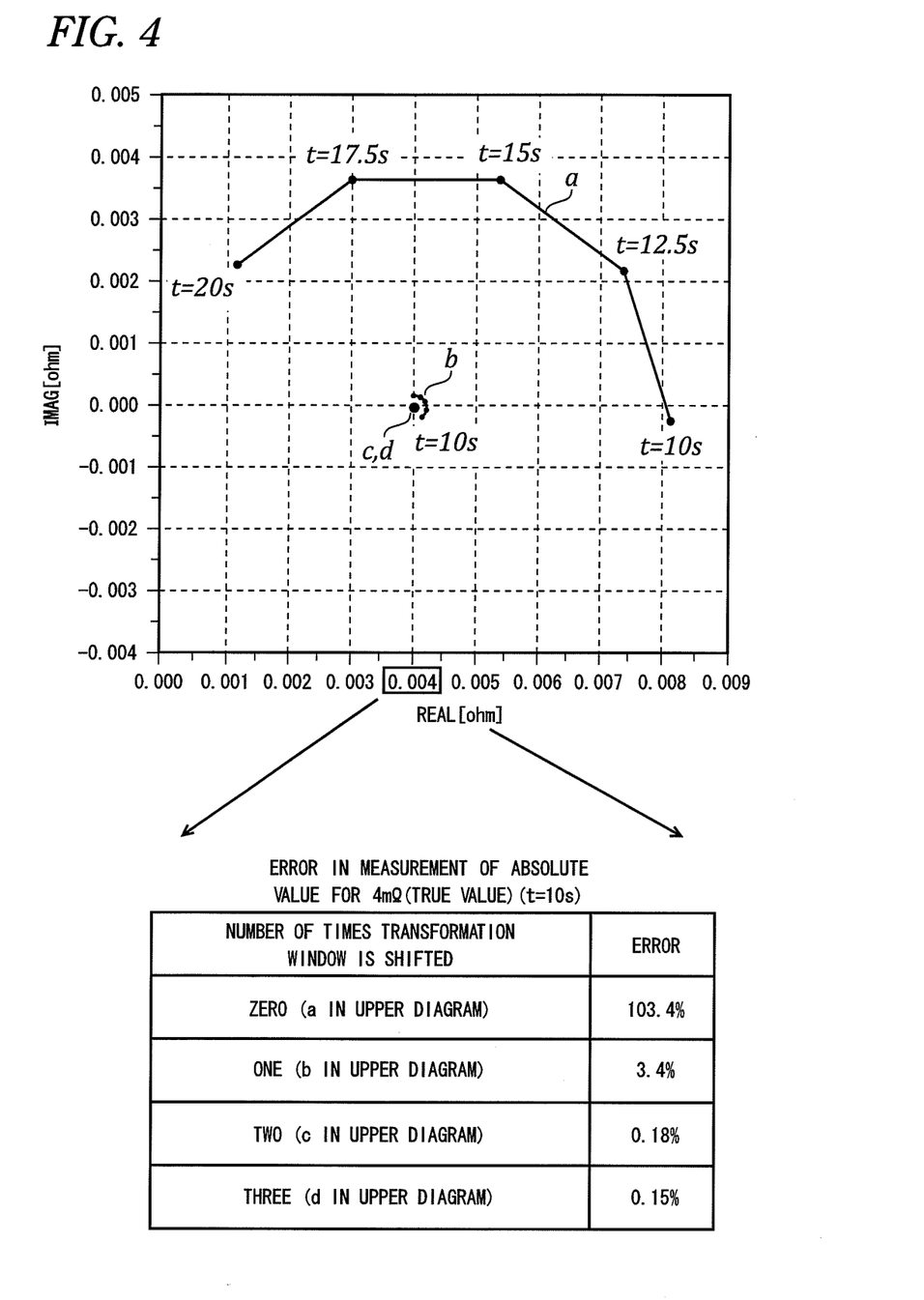
FIG. 4 is a diagram illustrating an error in the calculation result of impedance when the number of times a transformation window is shifted.

The impedance is calculated using the data of any point on the trajectory. FIG. 4 shows the calculation result of impedance based on data when the transformation window is shifted 2.5 s from t=10 s and the error of the absolute value with respect to a true value (4 mΩ).

In the related-art method that calculates impedance based on the Fourier transform data obtained from one transformation window, for example, the impedance at t=10 s is calculated as follows:

$$Z = V(10)/I(10) = (8.13 - 0.23i)[\Omega].$$

The error of the absolute value with respect to the true value (4 mΩ) is +103.4%.

Then, the transformation window is shifted 2.5 s to acquire the Fourier transform data, and the following calculation is performed.

$$Z=\{V(12,5)-V(10)\}/\{I(12.5)-I(10)\}=(4.13+0.18i) \ [m\Omega]$$

In this case, the error of the absolute value with respect to the true value is +3.4% which is less than that when t is 10 s.

In addition, the transformation window is shifted 2.5 s to acquire the Fourier transform data, and the following calculation is performed.

$$Z=[\{V(15)-V(12.5)\}-\{V(12.5)-V(10)\}]/[\{I(15)-I(12.5)\}-\{I(12.5)-I(10)\}]=(3.992+0.03i)[m\Omega]$$

In this case, the error of the absolute value with respect to the true value is −0.18%.

In addition, the transformation window is shifted 2.5 s to acquire the Fourier transform data, and the following calculation is performed.

$$Z=[\{(V(17.5)-V(15))-(V(15)-V(12.5))\}-\{(V(15)-V(12.5))-(V(12.5)-V(10))\}]/[\{(I(17.5)-I(15))-(I(15)-I(12.5))\}-\{(I(15)-I(12.5))-(I(12.5)-I(10))\}]=(3.994+0.003i)[m\Omega]$$

In this case, the error of the absolute value with respect to the true value is −0.15%.

In this way, a difference sequence calculating process of calculating the difference sequences of the current and the voltage from the Fourier transform data strings obtained by shifting the transformation window and calculating the difference sequences from the strings is repeatedly performed until data is united into one.

The impedance of the DUT 1 is calculated based on the ratio of the remaining current data and the remaining voltage data. As the number of Fourier transform data strings obtained by shifting the transformation window increases, the calculation result becomes closer to the true value.

The fact that as the number of Fourier transform data strings obtained by shifting the transformation window increases, the calculation result becomes closer to the true value will be described below.

When a DC component of a current applied is idc, an AC superimposed component is(t), a measured current is im(t), and a transient response voltage is vr(t), a measured voltage is vm(t), and impedance is Za, the measured current and the measured voltage can be represented as follows:

$$im(t)=idc+is(t); \text{ and}$$

$$vm(t)=Za(idc+is(t))+vr(t),$$

When the short-time Fourier transform is performed on the signals at the start time $t=t_0$ of the transformation window having the time width of the AC signal period, the short-time Fourier transform result can be represented as follows:

$$Im(t_0)=Is(t_0)$$

$$Vm(t_0)=Za \cdot Is(t_0)+Vr(t_0).$$

In this case, the following Expression A is established:

$$Vm(t_0)/Im(t_0)=Za\{Vr(t_0)/Is(t_0)\} \tag{A}$$

In the calculated impedance value Za, the second term is the error. This is the impedance calculating process according to the related art.

Then, a first difference sequence calculating process is performed and the following Expression B is established:

$$\{Vm(t_1)-Vm(t_0)\}/\{Im(t_1)-Im(t_0)\}=Za+[\{Vr(t_1)-Vr(t_0)\}/\{Is(t_1)-Is(t_0)\}] \tag{B}$$

In the calculated impedance value Za, the second term is the error.

Similarly, a second difference sequence calculating process is performed and the following Expression C is established:

$$[\{Vm(t_2)-Vm(t_1)\}-\{Vm(t_1)-Vm(t_0)\}]/[\{Im(t_2)-Im(t_1)\}-\{Im(t_1)-Im(t_0)\}]=Za+[\{Vr(t_2)-Vr(t_1)\}-\{Vr(t_1)-Vr(t_0)\}]/[\{Is(t_2)-Is(t_1)\}-\{Is(t_1)-Is(t_0)\}] \tag{C}$$

A third difference sequence calculating process is performed and the following Expression D is established:

$$[\{Vm(t_3)-Vm(t_2)\}-\{Vm(t_2)-Vm(t_1)\}-\{Vm(t_2)-Vm(t_1)\}-\{Vm(t_1)-Vm(t_0)\}]/[\{Im(t_3)-Im(t_2)\}-\{Im(t_2)-Im(t_1)\}-\{Im(t_2)-Im(t_1)\}-\{Im(t_1)-Im(t_0)\}]=Za+[\{Vr(t_3)-Vr(t_3)\}-\{Vr(t_3)-Vr(t_1)\}-\{Vr(t_2)-Vr(t_1)\}-\{Vr(t_1)-Vr(t_0)\}]/[\{Is(t_3)-Is(t_3)\}-\{Is(t_2)-Is(t_1)\}-\{Is(t_2)-Is(t_1)\}-\{Is(t_1)-Is(t_0)\}] \tag{D}$$

Figure 5:
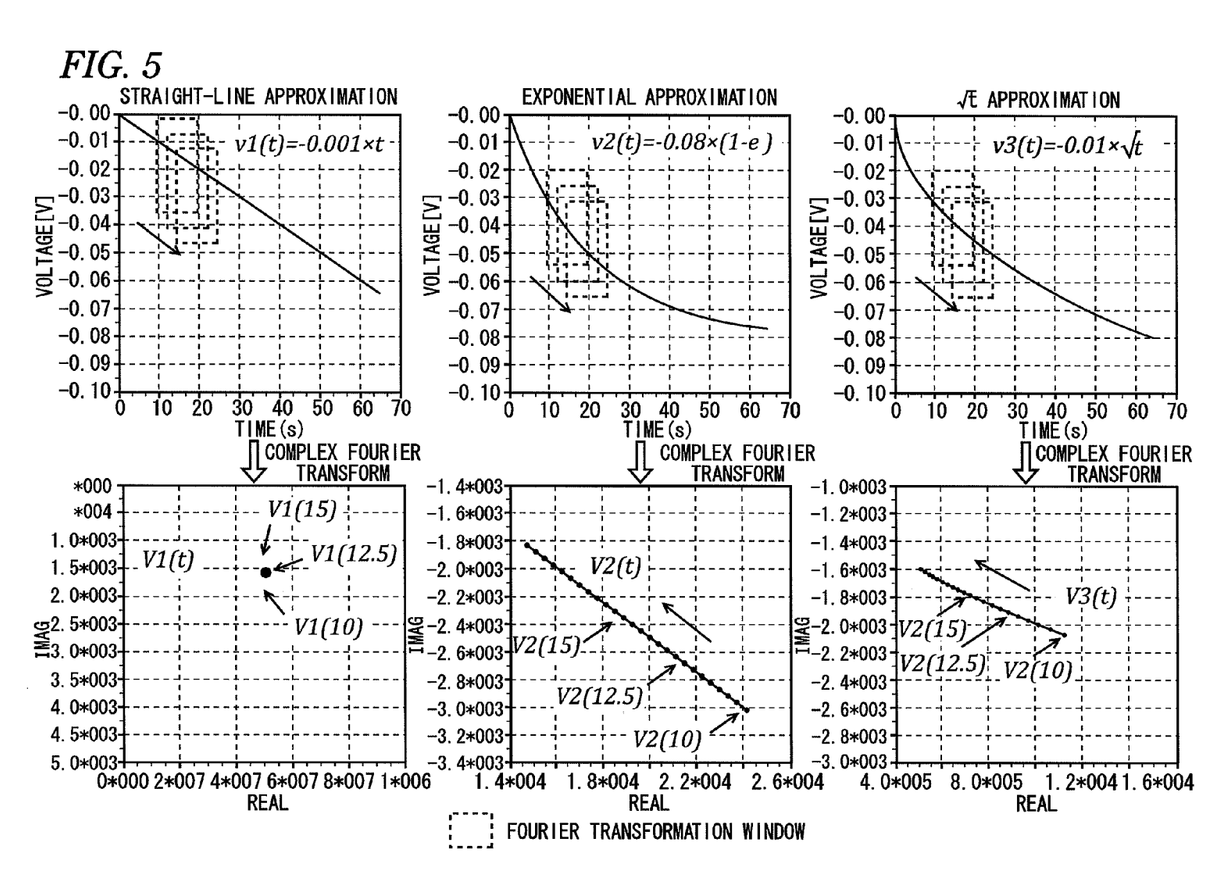
FIG. 5 is a diagram illustrating the trajectory of the Fourier transform result by a difference in transient response when the transformation window is shifted.

FIG. 5 shows the trajectory of the Fourier transform of the transient response when the transformation window is temporally shifted. Since the Fourier transform result when the transient response can be linearly approximated converges on one point, $Vr(t_0)=Vr(t_1)$ is established.

Therefore, the following relationship is established from Expression B:

$$\{Vm(t_1)-Ym(t_0)\}/\{Im(t_1)-Im(t_0)\}=Za.$$

The impedance value Za can be accurately calculated.

However, when the transient response cannot be linearly approximated, for example, when the transient response is approximate to an exponential function or is proportional to the square root of time, $Vr(t_0)$ is not equal to $Vr(t_1)$ and an error component remains.

For the trajectory of the Fourier transform shown in FIG. 3, while the trajectory of the Fourier transform of the current draws a circle, the trajectory of the Fourier transform of the transient response draws a straight line or a curve with a small curvature so as to converge on the origin.

Therefore, when the transformation window is shifted from $t_0$ to $t_1, t_2, t_3, \ldots$ in the range of one-sixth to five-sixths of the signal period, $|Vr(t_0)| \geq |Vr(t_1)-Vr(t_0)| \geq |\{Vr(t_2)-Vr(t_1)\}-\{Vr(t_1)-Vr(t_0)\}| \geq |[\{Vr(t_3)-Vr(t_3)\}-\{Vr(t_3)-Vr(t_1)\}-\{Vr(t_2)-Vr(t_1)\}-\{Vr(t_1)-Vr(t_0)\}]|$ is satisfied with respect to $|Is(t_0)| \leq |Is(t_1)-Is(t_0)| \leq |\{Is(t_2)-Is(t_1)\}-\{Is(t_1)-Is(t_0)\}| \leq |[\{Is(t_3)-Is(t_3)\}-\{Is(t_2)-Is(t_1)\}-\{Is(t_2)-Is(t_1)\}-\{Is(t_1)-Is(t_0)\}]|$.

As a result, the error term of each of Expressions (A) to (D) is as follows:

$$|Vr(t_0)|/|Is(t_0)| \geq |Vr(t_1)-Vr(t_0)|/|Is(t_1)-Is(t_0)| \geq |\{Vr(t_2)-Vr(t_1)\}-\{Vr(t_1)-Vr(t_0)\}|/|\{Is(t_2)-Is(t_1)\}-\{Is(t_1)-Is(t_0)\}| \geq |[\{Vr(t_3)-Vr(t_3)\}-\{Vr(t_2)-Vr(t_1)\}-\{Vr(t_1)-Vr(t_0)\}]|/|[\{Is(t_3)-Is(t_3)\}-\{Is(t_2)-Is(t_1)\}-\{Is(t_2)-Is(t_1)\}-\{Is(t_1)-Is(t_0)\}]|.$$

That is, when the process of calculating the difference sequence of the Fourier transform data strings obtained by shifting the transformation window from the measured current and the measured voltage is repeatedly performed to calculate impedance, it is possible to reduce an error by increasing the number of times the transformation window is shifted.

The time width of the transformation window may be an integral multiple of the signal period.

The transformation window may be shifted at any interval. However, when the difference sequence calculating process is repeatedly performed, the shift interval needs to be set such that an error in the measurement of impedance is reduced in terms of the balance with a transient response variation. In general, it is advantageous that the transformation window be shifted in the range of one-sixth to five-sixths of the superimposed signal period.

When the Fourier transform data strings of the current and voltage obtained by shifting the transformation window are $I_1, I_2, I_3, \ldots, V_1, V_2, V_3, \ldots$ and the calculated impedance is Z, the Fourier transform data strings of the current and voltage may be substituted into the following Expression.

$$Z = \frac{\sum_{k=0}^{n}(nCk \cdot (-1)^{n+k} \cdot Vk)}{\sum_{k=0}^{n}(nCk \cdot (-1)^{n+k} \cdot Ik)}$$

The period signal output from the period signal generator 6 is not limited to a single frequency, but may include other known frequency components. In this case, impedance may be calculated for each frequency component.

As described above, according to the present invention, even in the transient response of the voltage or the current, it is possible to achieve an AC impedance measuring device that measures impedance with a small error.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. An AC impedance measuring device, comprising:
a signal generator that provides a first signal on which a period signal is superimposed to a DUT (device under test);
a Fourier transform unit that performs Fourier transform on current data and voltage data output from the DUT using a transformation window having a time width that is an integral multiple of a period of the first signal, while sequentially shifting a start time of the transformation window, thereby obtaining a plurality of Fourier transform data strings of the voltage data and the current data, wherein at least one of the current data and the voltage data includes a transient response;
a difference sequence calculator that sequentially calculates a first difference sequence of the Fourier transform data strings of the voltage data and a second difference of the Fourier transform data strings of the current data; and
and impedance calculator that calculates an impedance of the DUT based on a ratio of the first difference sequence and the second difference sequence.

2. The device of claim 1,
wherein the Fourier transform unit sequentially shifts the start time of the transformation window in a range of one-sixth to five-sixths of the period of the first signal.

3. The device of claim 1,
wherein the period signal includes a plurality of frequency components, and the impedance calculator calculates the impedance of the DUT for each of the frequency components.

4. The device of claim 2,
wherein the period signal includes a plurality of frequency components, and
the impedance calculator calculates the impedance of the DUT for each of the frequency components.

5. The device of claim 1, further comprising:
a sampling unit that converts the current data and the voltage data output from the DUT into a digital signal based on a sample clock.

6. The device of claim 1, further comprising:
a current data storage unit; and
a voltage data storage unit.

7. The device of claim 1, further comprising:
a display unit that displays the impedance of the DUT.

8. The AC impedance measuring device of claim 1, wherein the difference sequence calculation process of the Fourier transform data strings of the voltage data is obtained by shifting the transformation window and calculating the difference sequences from the Fourier transform data strings repeatedly until the Fourier transform data strings are united into one calculation.

9. The AC impedance measuring device of claim 1, wherein the arithmetic unit sets an operation start time (Step S1), sets the time width of the transformation window (Step S2), acquires the current data and the voltage data as the Fourier transform data used for an operation (Step S3), performs Fourier transform on the acquired current data and voltage data (Step S4), stores a Fourier transform result, creates a Fourier transform data string (Step S5), and repeatedly performs steps S1 to S5 a predetermined number of times while changing the operation start time each time.

* * * * *